(12) United States Patent
Gai et al.

(10) Patent No.: US 9,385,171 B2
(45) Date of Patent: Jul. 5, 2016

(54) ACTIVE MATRIX ORGANIC LIGHT-EMITTING DIODE ARRAY SUBSTRATE, MANUFACTURING METHOD THEREOF AND DISPLAY DEVICE INCLUDING THE SAME

(71) Applicant: BOE TECHNOLOGY GROUP CO., LTD., Beijing (CN)

(72) Inventors: Cuili Gai, Beijing (CN); Danna Song, Beijing (CN); Baoxia Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/437,120

(22) PCT Filed: Mar. 31, 2014

(86) PCT No.: PCT/CN2014/074423
§ 371 (c)(1),
(2) Date: Apr. 20, 2015

(87) PCT Pub. No.: WO2015/123915
PCT Pub. Date: Aug. 27, 2015

(65) Prior Publication Data
US 2016/0013256 A1 Jan. 14, 2016

(30) Foreign Application Priority Data
Feb. 24, 2014 (CN) .......................... 2014 1 0062448

(51) Int. Cl.
*H01L 27/32* (2006.01)
*H01L 51/56* (2006.01)
*G09G 3/32* (2016.01)

(52) U.S. Cl.
CPC .............. *H01L 27/3248* (2013.01); *G09G 3/32* (2013.01); *H01L 51/56* (2013.01)

(58) Field of Classification Search
USPC ............................................. 257/40; 438/99
See application file for complete search history.

(56) References Cited

U.S. PATENT DOCUMENTS

2002/0070197 A1* 6/2002 Ahn ..................... G02F 1/13439
216/13
2008/0073686 A1 3/2008 Kuo
(Continued)

FOREIGN PATENT DOCUMENTS

CN 1823296 A 8/2006
CN 101165905 A 4/2008
(Continued)

OTHER PUBLICATIONS

First Chinese Office Action and English translation dated Nov. 19, 2015, for corresponding Chinese Application No. 201410062448.6.
(Continued)

*Primary Examiner* — Zandra Smith
*Assistant Examiner* — Lawrence Tynes, Jr.
(74) *Attorney, Agent, or Firm* — Kinney & Lange, P.A.

(57) ABSTRACT

An active matrix organic light-emitting diode array substrate, a manufacturing method thereof and a display device including the same are disclosed to improve the aperture ratio of pixel of the array substrate and the display quality of the display device. The array substrate includes: a substrate; and a plurality of pixel units located on the substrate and arranged in array manner, each of the pixel units comprising a thin film transistor, a first transparent electrode, a second transparent electrode and a gate insulation layer provided between the first transparent electrode and the second transparent electrode. The first transparent electrode is provided on the substrate and is electrically connected to a gate of the thin film transistor; and the second transparent electrode is electrically connected to a drain of the thin film transistor, and the second transparent electrode is positioned opposite to the first transparent electrode to form a storage capacitor of the pixel unit therebetween.

14 Claims, 2 Drawing Sheets

(56) References Cited

U.S. PATENT DOCUMENTS

2009/0059110 A1* 3/2009 Sasaki ............... G02F 1/134363
    349/39
2011/0220897 A1* 9/2011 Shin .................. G02F 1/136213
    257/59

FOREIGN PATENT DOCUMENTS

| | | |
|---|---|---|
| CN | 101819361 A | 9/2010 |
| CN | 102194742 A | 9/2011 |
| CN | 102650783 A | 8/2012 |
| CN | 202363081 U | 8/2012 |
| CN | 203707137 U | 7/2014 |
| JP | 2008276108 A | 11/2008 |

OTHER PUBLICATIONS

English translation of Written Opinion dated Nov. 21, 2014, for corresponding PCT Application No. PCT/CN2014/074423.

International Search Report and Written Opinion in Chinese dated Nov. 10, 2014, for corresponding PCT Application No. PCT/CN2014/074423.

* cited by examiner

ACTIVE MATRIX ORGANIC LIGHT-EMITTING DIODE ARRAY SUBSTRATE, MANUFACTURING METHOD THEREOF AND DISPLAY DEVICE INCLUDING THE SAME

BACKGROUND OF THE INVENTION

1. Field of the Invention

The present invention relates to a display device, more particularly, relates to an active matrix organic light-emitting diode array substrate, a manufacturing method thereof and a display device including the same.

2. Description of the Related Art

An organic light-emitting diode (OLED) display screen has been widely used in display device due to its following advantages: thin and light structure, wide visual angle, active light-emission, continue adjustment of emitting light color, low cost, quick response, low power consumption, low drive voltage, wide range of work temperature, simple manufacturing process, high emission efficiency, and the capability of becoming flexible and the like.

According to the driving modes, the OLED may be divided into Passive Matrix (PM) OLED and Active Matrix (AM) OLED. In the PMOLED, the anodes and the cathodes are arranged in matrix manner, and the pixels in the array may be lighten in scanning manner, wherein, each of the pixels woks in the short-duration pulse mode and may emit light with high luminance for a moment. The PMOLED has a simple structure and may lower the manufacturing cost efficiently, but is not suitable for a display panel with large scale and high resolution due to the relatively high drive voltage. In the AMOLED, each of the pixels is controlled by using an independent TFT (Thin Film Transistor, TFT) and may emit light continuously and independently under drive of TFT. The AMOLED has lower drive voltage and longer life time and may be applied to a display panel with large scale, but has relatively complicated manufacturing process and relatively high cost.

According to the light-emission types, the AMOLED may be divided into top-emission type (the light is emitted out from the upper substrate) AMOLED and bottom-emission type (the light is emitted out from the lower substrate) AMOLED. FIG. 1 is a schematic view of sectional structure of a pixel unit at the position of TFT of bottom-emission type AMOLED array substrate in prior art. The pixel unit comprises: a substrate 1, a gate 22 located on the substrate 1, a gate insulation layer 4 covering the gate 22, an active layer 5 located on the gate insulation layer 4 and opposite to the position of the gate 22, a source 6 and a drain 7 oppositely provided on the active layer 5, a first insulation layer 8 located on the source 6 and the drain 7, and a transparent electrode 23 connected to the drain 7 through a via 9 penetrating the first insulation layer 8, wherein, a part area of the gate 22 is aligned with the position of the drain 7, thereby a storage capacitor 100 is formed therebetween.

The array substrate of the bottom-emission type AMOLED is provided with TFTs and metal wires, which block a part of light and become an important factor impacting on an aperture ratio of pixel (the aperture ratio means the ratio of an area of the pixel capable of emitting light to an area of the pixel). More particularly, in order to solve the problem of nonuniform display image quality due to the differences among pixels, a pixel structure with compensation circuitry is widely proposed, wherein, the pixel unit comprises two or more TFTs. With respect to the bottom-emission type structure, the pixel area occupied by the TFTs and the metal wires is larger; the aperture ratio of pixel is smaller, therefore, the luminance of emitted light should be increased accordingly, the light-emission device will certainly have increased power consumption and shorten life time. As a result of this, the improvement of the aperture ratio of pixel is becoming a pressing problem to be solved.

SUMMARY OF THE INVENTION

Embodiments of the present invention provide an active matrix organic light-emitting diode array substrate, a manufacturing method thereof and a display device including the same so as to improve the aperture ratio of pixel of the array substrate.

According to an embodiment of the present invention, there is provided an active matrix organic light-emitting diode array substrate, comprising:

a substrate; and a plurality of pixel units located on the substrate and arranged in an array, each of the pixel units comprising a thin film transistor, a first transparent electrode, a second transparent electrode and a gate insulation layer provided between the first transparent electrode and the second transparent electrode;

wherein, the first transparent electrode is provided on the substrate and is electrically connected to a gate of the thin film transistor, and the second transparent electrode and the first transparent electrode are positioned opposite to each other to form a storage capacitor of the pixel unit therebetween.

In the above active matrix organic light-emitting diode array substrate, the first transparent electrode and the second transparent electrode have the same electrode pattern.

In the above active matrix organic light-emitting diode array substrate, the first transparent electrode is partly lapped over an upper surface of the gate.

In the above active matrix organic light-emitting diode array substrate, the first transparent electrode is used as a bottom electrode of the storage capacitor of the pixel unit, and the second transparent electrode is used as a pixel electrode of the pixel unit as well as a top electrode of the storage capacitor of the pixel unit.

In the above active matrix organic light-emitting diode array substrate, a first insulation layer is formed on the thin film transistor, and the second insulation layer is electrically connected with the drain of the thin film transistor through a via formed in the first insulation layer.

According to a further embodiment of the present invention, there is provided a manufacturing method for the active matrix organic light-emitting diode array substrate, comprising steps of:

forming a gate of a thin film transistor on a substrate;

forming a first transparent electrode electrically connected to the gate on the substrate and the gate;

forming a gate insulation layer on the gate and the first transparent electrode;

forming an active layer, a source and a drain of the thin film transistor on the gate insulation layer;

forming a second transparent electrode electrically connected to the drain of the thin film transistor and opposite to the first transparent electrode.

In the above manufacturing method, the first transparent electrode and the second transparent electrode are formed by a mask with the same pattern.

In the above manufacturing method, in the step of forming the first transparent electrode electrically connected to the gate on the substrate and the gate, the first transparent electrode which is partly lapped over an upper surface of the gate is formed on the substrate.

In the above manufacturing method, in the step of forming the active layer, the source and the drain of the thin film transistor on the gate insulation layer, a first insulation layer is formed on the active layer, the source and the drain, and a via through which the drain of the thin film transistor is connected with the second transparent electrode is formed in the first insulation layer.

According to a still further embodiment of the present invention, there is provided a display device comprising the active matrix organic light-emitting diode array substrate of any of above technical solutions. The display device has relatively high aperture ratio of pixel, improved display quality, lower power consumption and longer life time.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED
EMBODIMENTS OF THE INVENTION

In order to completely understand the object, technical solution and advantages of the present invention, exemplary embodiments of the present disclosure will be described hereinafter in detail with reference to the attached drawings. Before the description, the person skilled in the art should understand that the invention described herein can be modified and the modified technical solution can obtain the technical effect of the present invention. Thus, it should be understood by the person skilled in the art that the above description is merely wide disclosure, the content of which is not limited to the exemplary embodiments described by the present invention. The same reference signs in different drawings indicate the same or similar structures.

According to a general concept of the present invention, there is provided an active matrix organic light-emitting diode array substrate (AMOLED for short hereinafter), a method of manufacturing the AMOLED and a display device including the same. In the technical solution of the array substrate of the embodiment of the present invention, a first transparent electrode is provided on a substrate and is electrically connected to a gate of a thin film transistor; a second transparent electrode is electrically connected to a drain of the thin film transistor, and the second transparent electrode is arranged opposite to the first transparent electrode so as to form a storage capacitor of a pixel unit therebetween. Opaque areas of the gate and the drain may be designed to be relatively small, and the first and second transparent electrode with a high light transmittance has a relatively large area, and the storage capacitor is formed therebetween. In this way, the aperture ratio of pixel of the array substrate is improved, and the display device comprising the array substrate of the embodiment of the present invention thus has improved display quality, lower power consumption and longer life time.

Figure 2:
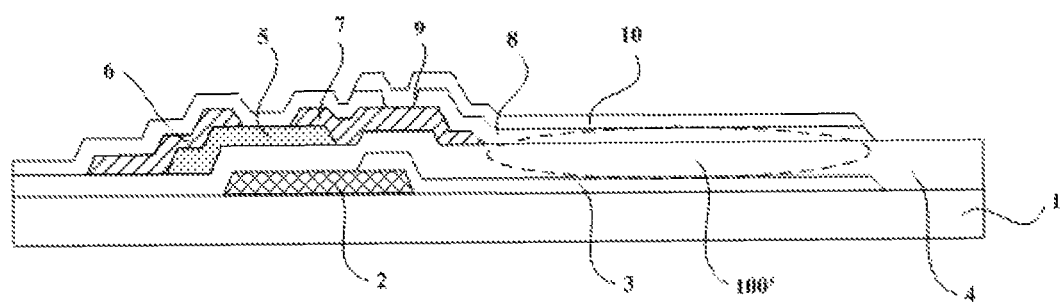
FIG. 2 is a schematic view of sectional structure of a pixel unit at a position of TFT of an AMOLED array substrate according to a first exemplary embodiment of the present invention.

As shown in FIG. 2, the AMOLED array substrate according to the first exemplary embodiment of the present invention comprises a substrate 1 and a plurality of pixel units located on the substrate 1 and arranged in array manner, wherein, each of the pixels comprises a thin film transistor, a first transparent electrode 3 and a second transparent electrode 10. The first transparent electrode 3 is provided on the substrate 1 and is electrically connected to a gate 2 of the thin film transistor. A gate insulation layer 4 is provided on the gate 2 and the first transparent electrode 3, and a source and a drain of the thin film transistor are formed on the gate insulation layer 4. A first insulation layer is provided on the source and the drain, and a second transparent electrode 10 is provided on the first insulation layer. The second transparent electrode 10 is electrically connected to the drain 7 of the thin film transistor and is arranged opposite to the first transparent electrode 3, i.e. the second transparent electrode 10 is at least partly overlapped with the first transparent electrode 3 in a direction perpendicular to the substrate, to obtain a large overlapping area. In an exemplary embodiment, the first transparent electrode 3 is located directly below the second transparent electrode 10, that's to say, the second transparent electrode 10 is fully overlapped with the first transparent electrode 3.

Figure 1:
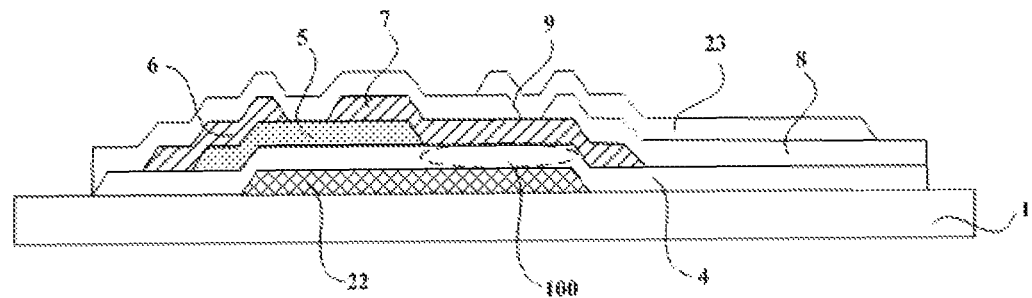
FIG. 1 is a schematic view of sectional structure of a pixel unit at a position of TFT of an AMOLED array substrate in prior art.

As can be seen from the comparison between FIG. 1 and FIG. 2, a part of regions of the gate 22 needs to be opposite to the drain 7 to form the storage capacitor 100 in FIG. 1. In order to conform the value of the storage capacitor 100 to the design requirement, the area of this part of the regions is arranged generally large, thereby the aperture ratio of pixel being impacted. However, in the AMOLED array substrate as shown in FIG. 2, the areas of the gate 2 and the drain 7 which are opaque may be designed to be relatively small, and the second transparent electrode 10 with a high light transmittance is arranged to at least partly overlap over the first transparent electrode 3 with a high light transmittance in thickness direction, and the overlapping area is relatively large and a storage capacitor 100' is formed therebetween. Therefore, as compared with the AMOLED array substrate as shown in FIG. 1 in the prior art, the aperture ratio of pixel of the AMOLED array substrate of the embodiment of the present invention can be significantly increased, and the display device comprising the array substrate of the embodiment of the present invention thus has improved display quality, lower power consumption and longer life time.

In an embodiment, the first transparent electrode 3 and the second transparent electrode 10 have the same pattern. In this way, processes of patterning the first transparent electrode 3 and the second transparent electrode 10 may be performed by the same mask. During the manufacture of the AMOLED array substrate of the embodiment of the present invention, the aperture ratio of pixel may be increased without increasing the number of the mask; thereby the manufacturing cost is significantly reduced.

In a further embodiment, the first transparent electrode 3 is used as the bottom electrode of the storage capacitor 100 of the pixel unit, and the second transparent electrode 10 is used as the pixel electrode of the pixel unit (the pixel electrode can be used as the anode or cathode of the OLED display element) as well as the top electrode of the storage capacitor 100 of the pixel unit at the same time. In this way, the first transparent electrode 3, the second transparent electrode 10 and the pixel electrode are actually manufactured by the same mask, thereby further reducing the manufacturing cost.

Still referring to FIG. 2, the first transparent electrode 3 is partly lapped over the upper surface of the gate 2. In this way, the first transparent electrode 3 may be reliably electrically connected to the gate 2, and requirement for the manufacturing precision of the first transparent electrode 3 may be relatively low, thereby the manufacturing cost is further reduced. It should be noted that in an alternative embodiment, the gate 2 may be partly lapped over the first transparent electrode 3 so as to similarly realize the reliable connection between the first transparent electrode 3 and the gate 2.

An active layer 5, the source 6 and the drain 7 of the thin film transistor, on which the first insulation layer 8 is formed, may be formed on the gate insulation layer 4. The second insulation layer 10 is electrically connected to the drain 7 of the thin film transistor through the via 9 formed in the first insulation layer 8, thereby the manufacturing process is simply and the electrical connection is reliable.

To be specific, in the AMOLED array substrate according to the first exemplary embodiment as shown in FIG. 2, each of the pixel units comprises:

the gate 2 provided on the substrate 1;

the first transparent electrode 3 provided on the substrate 1 and electrically connected to the gate 2;

the gate insulation layer 4 provided on the gate 2 and the first transparent electrode 3;

the active layer 5 provided on the gate insulation layer 4 and opposite to the gate 2;

the source 6 and the drain 7 oppositely provided on the active layer 5;

the first insulation layer 8 provided on the source 6 and the drain 7 and having the via 9 leading to the drain 7;

the second transparent electrode 10 provided on the first insulation layer 8 and electrically connected to the drain 7 through the via 9 and opposite to the first transparent electrode 3.

Figure 3:
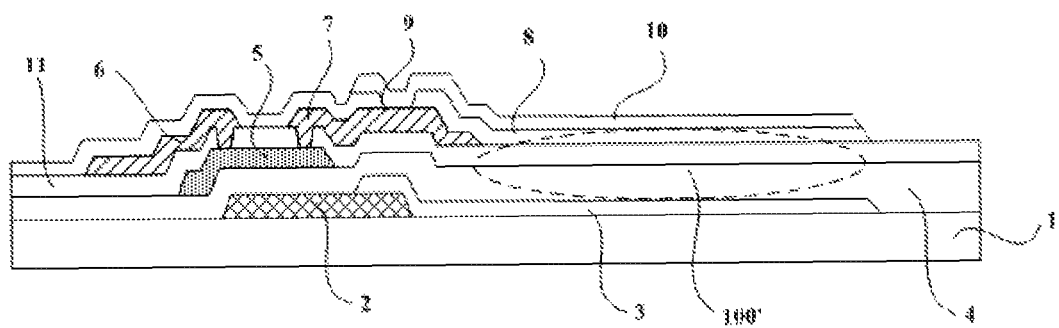
FIG. 3 is a schematic view of sectional structure of a pixel unit at a position of TFT of the AMOLED array substrate according to a second exemplary embodiment of the present invention.

FIG. 3 is a schematic view of sectional structure of a pixel unit at the position of TFT of the AMOLED array substrate according to a second exemplary embodiment of the present invention. When the active layer 5 is made of oxide semiconductor material, for example, Indium gallium zinc oxide or hafnium Indium zinc oxide, there is also provided with an etch-resistant layer 11 between the active layer 5 and the source 6 and between the active layer 5 and the drain 7, and the source 6 and the drain 7 penetrate the corresponding vias (not shown by reference sign) of the etch-resistant layer 11 to connect to the active layer 5, respectively. When the metal material used as the source and the drain is etched, the etch-resistant layer 11 may efficiently prevent the channel region of the active layer 5 from being damaged by etching, such that the thin film transistor may work normally so as to improve the pass percent of the array substrate.

The substrate 1 may be made of a glass substrate, a resin substrate or a plastic substrate and the like. The material for making the gate 2, the source 6 and the drain 7 has no limitation, and for example, aluminum, copper and molybdenum can be used. The active layer 5 may be made of amorphous silicon, polycrystalline silicon or oxide semi-conductor material, for example, Indium gallium zinc oxide or hafnium Indium zinc oxide, and the like. The first transparent electrode 3 and the second transparent electrode 10 may be made of the same material and also may be made of different material, such as they may be made of Indium tin oxide and Indium zinc oxide, respectively. The material for making the gate insulation layer 4 may include silicon nitride, and the first insulation layer 8 may include a plurality of layers, such as silicon nitride layer and flattened organic film layer, which is located on the silicon nitride layer, such as a resin layer).

The pixel drive circuitry used for the AMOLED array substrate of the embodiment of the present invention may comprise a 2T1C structure (i.e. the pixel drive circuitry comprises two thin film transistors and a storage capacitor) and may also comprise a compensation structure with more than two thin film transistors. In these pixel structures, since the areas of the source and the drain of the thin film transistors are relatively small, the aperture ratio of pixel is relatively large, the display quality is relatively good, and the power consumption is relatively low.

Referring to FIG. 2, as compared with the prior art as shown in FIG. 1, the area of the storage capacitor 100' of the AMOLED array substrate of this embodiment is increased to be about five times of that in the prior art. Meanwhile, the medium thickness of the storage capacitor 100' is a sum of thickness of the gate insulation layer 4 and the thickness of the first insulation layer 8 and also increases to be about five times of that in the prior art as shown in FIG. 1 (in prior art, the medium thickness of the storage capacitor 100 is equal to the thickness of the gate insulation layer 4). As can be inferred from the calculation formula of the value of storage capacitor $C=\in A/d$ (wherein C is the value of storage capacitor, $\in$ is the dielectric constant, A is the area of polar plate of the storage capacitor, d is the medium thickness of the storage capacitor), the value of storage capacitor is not decreased and may be in conformity with the electrical performance requirement of the product.

Figure 4:
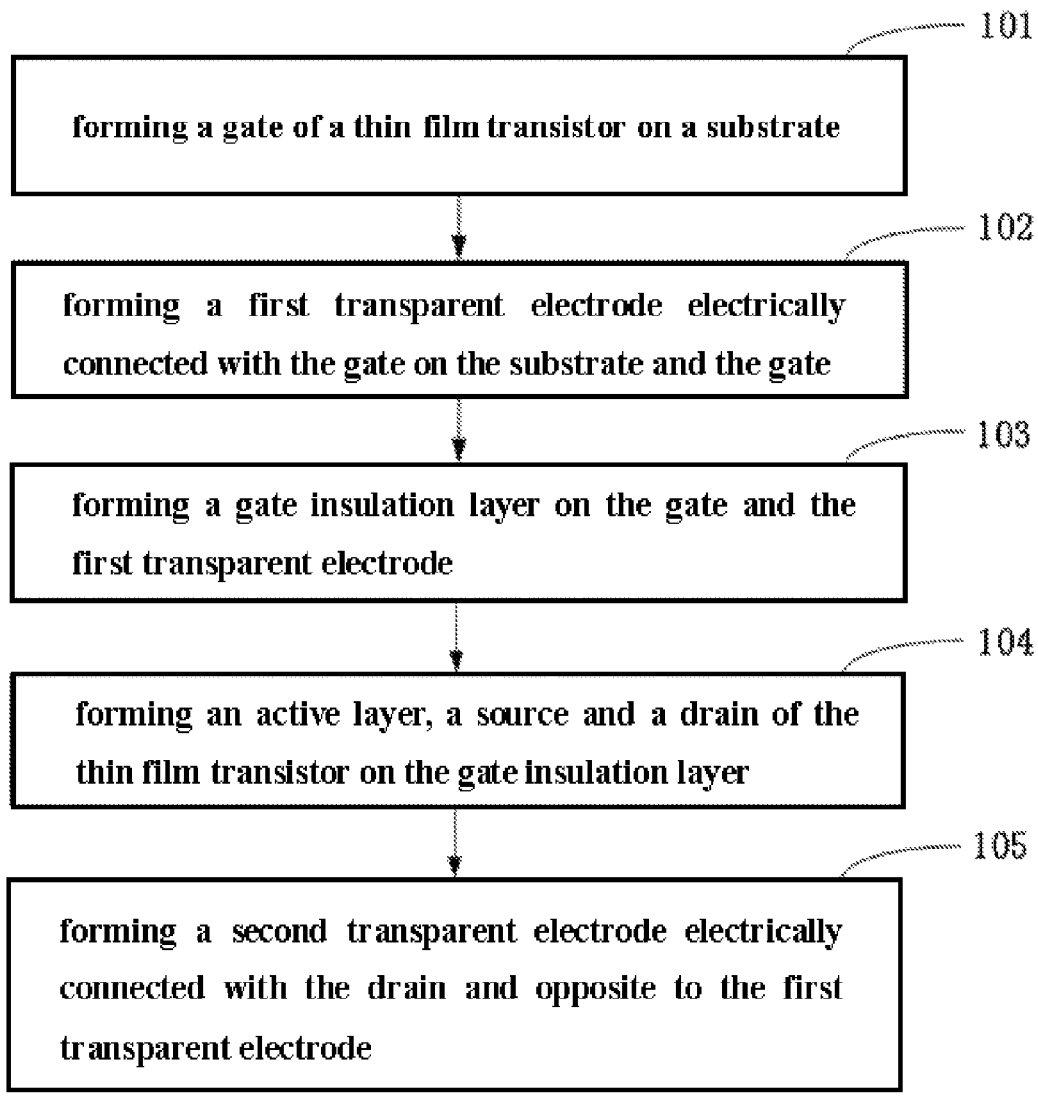
FIG. 4 is a flow chart of a method of manufacturing an AMOLED array substrate according to an exemplary embodiment of the present invention.

As shown in FIG. 4, there is also provided a method of manufacturing an AMOLED array substrate according to embodiments (as shown in FIG. 2) of the present invention, the method comprising steps of:

Step 101: forming a gate 2 of a thin film transistor on a substrate 1;

Step 102: forming a first transparent electrode 3 electrically connected to the gate 2 on the substrate 1 and the gate 2;

Step 103: forming a gate insulation layer 4 on the gate 2 and the first transparent electrode 3;

Step 104: forming an active layer 5, and a source 6 and a drain 7 of the thin film transistor on the gate insulation layer 4;

Step 105: forming a second transparent electrode 10 electrically connected to the drain 7 of the thin film transistor 9 and opposite to the first transparent electrode 3.

The pattern of each layer on the substrate 1 is usually formed by patterning process, one patterning process generally comprises process of cleaning substrate, forming film, applying photoresist, exposing, developing, etching, and peeling photoresist and the like. With respect to a metal layer, it is generally formed by means of physical vapor deposition (for example, magnetron sputtering), and is patterned by wet etching. However, with respect to a non-metal layer, it is generally formed by means of chemical vapor deposition and is patterned by dry etching. After the step 105, each of the functional layers of the OLED is continuously formed by means of evaporation.

In the AMOLED array substrate made by the above method, the non-transparent areas of the gate 2 and the drain 7 may be designed to be relatively small, and the second transparent electrode 10 with a high light transmittance is opposite to the first transparent electrode 3 with a high light transmittance, and the overlapping area thereof is relatively large and a storage capacitor 100' is formed therebetween. Thus, as compared with the prior art, the aperture ratio of pixel of the AMOLED array substrate of the embodiment of the present invention may be significantly increased, and the display device thus has improved display quality, lower power consumption and longer life time.

In an embodiment, in step 102 and step 105, the first transparent electrode 3 and the second transparent electrode 10 are made by a mask having the same pattern. In this way, five pieces of masks are used to manufacture the pixel structure as shown in FIG. 2. As compared with the prior art, this method will not increase the number of used masks, but reduce the manufacturing cost while increasing the aperture ratio of pixel.

In an embodiment, in step 102, the first transparent electrode 3 is formed on the substrate 1 and partly lap-joined onto the upper surface of the gate 2. In this way, the first transparent electrode 3 may be reliably electrically connected to the gate 2 and be manufactured with relatively low precision requirement, thus, the manufacturing cost can be further reduced.

In step 103, a first insulation layer 8 is further formed on the active layer 5, and the source 6 and the drain 7 of the thin film transistor, and a via 9 through which the drain 7 of the thin film transistor is connected with the second transparent electrode 10 is formed in the first insulation layer 8.

Specifically, the method for manufacturing the AMOLED array substrate as shown in FIG. 2 includes steps of:

forming the gate 2 on the substrate 1;

forming the first transparent electrode 3 electrically connected to the gate 2 on the substrate 1;

forming the gate insulation layer 4 on the gate 2 and the first transparent electrode 3;

forming the active layer 5 opposite to the gate 2 on the gate insulation layer 4;

forming the source 6 and the drain 7 oppositely provided on the active layer 5;

forming the first insulation layer 8 on the active layer 6, the source 6 and the drain 7, and forming the via 9 leading to the drain 7 on the first insulation layer 8;

forming the second transparent electrode 10 on the first insulation layer 8, the second transparent electrode 10 being electrically connected to the drain 7 through the via 9 and opposite to the first transparent electrode 3.

Further, as shown in FIG. 3, when the active layer 5 is made of oxide semi-conductor, after forming the active layer 5 and before forming the source 6 and the drain 7, an etch-resistant layer 11 is formed on the active layer 5, and vias are formed at the positions on the etch-resistant layer 11 corresponding to the source 6 and the drain 7, respectively.

In the subsequent steps, when the metal material for forming the source and the drain is etched, the etch-resistant layer 11 may efficiently prevent the channel region of the active layer 5 from being damaged by etching such that the thin film transistor may work normally so as to improve the pass percent of the array substrate.

There is also provided a display device in an embodiment according to a further aspect of the present invention, and the display device comprises the AMOLED array substrate according to any of above-mentioned embodiments. The display device has relatively high aperture ratio of pixel, improved display quality, lower power consumption and longer life time. The display device is not limited to specific type of display device, for example, may be an AMOLED display device and an AMOLED TV or the like.

It is obvious for the person skilled in the art that various changes or modifications may be made in these embodiments without departing from the principles and spirit of the disclosure. In this way, supposing that these changes or modification to the present invention are within the claims and their equivalents, the present invention intends to include these changes or modification therein.

What is claimed is:

1. An active matrix organic light-emitting diode array substrate, comprising:
    a substrate; and
    a plurality of pixel units located on the substrate and arranged in an array, each of the pixel units comprising a thin film transistor, a first transparent electrode, a second transparent electrode and a gate insulation layer provided between the first transparent electrode and the second transparent electrode;
    wherein, the first transparent electrode is provided on the substrate and is electrically connected to a gate of the thin film transistor; the second transparent electrode is electrically connected to a drain of the thin film transistor, and the second transparent electrode and the first transparent electrode are positioned opposite to each other to form a storage capacitor of the pixel unit therebetween.

2. The active matrix organic light-emitting diode array substrate of claim 1, wherein, the first transparent electrode and the second transparent electrode have the same electrode pattern.

3. The active matrix organic light-emitting diode array substrate of claim 1, wherein, the first transparent electrode is partly lapped over an upper surface of the gate.

4. The active matrix organic light-emitting diode array substrate of claim 1, wherein, the first transparent electrode is used as a bottom electrode of the storage capacitor of the pixel unit, and the second transparent electrode is used as a pixel electrode of the pixel unit as well as a top electrode of the storage capacitor of the pixel unit.

5. The active matrix organic light-emitting diode array substrate of claim 1, wherein, a first insulation layer is formed on the thin film transistor, and the second insulation layer is electrically connected with the drain of the thin film transistor through a via formed in the first insulation layer.

6. A display device comprising the active matrix organic light-emitting diode array substrate of claim 1.

7. The display device of claim 6, wherein, the first transparent electrode and the second transparent electrode have the same electrode pattern.

8. The display device of claim 6, wherein, the first transparent electrode is partly lapped over an upper surface of the gate.

9. The display device of claim 6, wherein, the first transparent electrode is used as a bottom electrode of the storage capacitor of the pixel unit, and the second transparent electrode is used as a pixel electrode of the pixel unit as well as a top electrode of the storage capacitor of the pixel unit.

10. The display device of claim 6, wherein, a first insulation layer is formed on the thin film transistor, and the second transparent electrode is electrically connected with the drain of the thin film transistor through a via formed in the first insulation layer.

11. A manufacturing method for an active matrix organic light-emitting diode array substrate, comprising steps of:
    forming a gate of a thin film transistor on a substrate;
    forming a first transparent electrode electrically connected to the gate;
    forming a gate insulation layer on the gate and the first transparent electrode;
    forming an active layer, a source and a drain of the thin film transistor on the gate insulation layer; and forming a second transparent electrode electrically connected to the drain of the thin film transistor and opposite to the first transparent electrode.

12. The manufacturing method of claim 11, wherein, the first transparent electrode and the second transparent electrode are formed by a mask with the same pattern.

13. The manufacturing method of claim 11, wherein, in the step of forming the first transparent electrode electrically connected to the gate, the first transparent electrode is partly lapped over an upper surface of the gate formed on the substrate.

14. The manufacturing method of claim 11, wherein, in the step of forming the active layer, the source and the drain of the thin film transistor on the gate insulation layer, a first insulation layer is formed on the active layer, the source and the drain, and a via through which the drain of the thin film transistor is connected with the second transparent electrode is formed in the first insulation layer.

* * * * *